(12) United States Patent
Zhou et al.

(10) Patent No.: US 12,074,094 B2
(45) Date of Patent: Aug. 27, 2024

(54) MONOLITHIC CONDUCTIVE COLUMN IN A SEMICONDUCTOR DEVICE AND ASSOCIATED METHODS

(71) Applicant: Micron Technology, Inc., Boise, ID (US)

(72) Inventors: Wei Zhou, Boise, ID (US); Kyle K. Kirby, Eagle, ID (US); Bret K. Street, Meridian, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 17/670,378

(22) Filed: Feb. 11, 2022

(65) Prior Publication Data

US 2023/0260875 A1    Aug. 17, 2023

(51) Int. Cl.
*H01L 21/00* (2006.01)
*H01L 21/768* (2006.01)
(Continued)

(52) U.S. Cl.
CPC ...... *H01L 23/481* (2013.01); *H01L 21/76877* (2013.01); *H01L 21/76898* (2013.01);
(Continued)

(58) Field of Classification Search
CPC ............ H01L 23/481; H01L 21/76877; H01L 21/76898
See application file for complete search history.

(56) References Cited

U.S. PATENT DOCUMENTS 8,563,403 B1 * 10/2013 Farooq ................ H01L 21/8221
 257/E21.597
9,865,570 B1 * 1/2018 England .................. H01L 24/17
(Continued)

FOREIGN PATENT DOCUMENTS

CN    116598278 A  *  8/2023  ......... H01L 25/0657
CN    116598286 A  *  8/2023  ....... H01L 21/76877
(Continued)

OTHER PUBLICATIONS

U.S. Appl. No. 17/670,391—Unpublished Patent Application to Wei Zhou et al., filed Feb. 11, 2022, titled "Monolithic Conductive Column In A Semiconductor Device And Associated Methods", 43 pages.
(Continued)

*Primary Examiner* — Laura M Menz
(74) *Attorney, Agent, or Firm* — Perkins Coie LLP

(57) ABSTRACT

A semiconductor device having monolithic conductive columns, and associated systems and methods, are disclosed herein. The semiconductor device can include a semiconductor substrate, a conductive pad, an opening, a non-conductive liner, and a plug of non-conductive material. The conductive pad may be at a surface of the semiconductor substrate. The opening may extend through the semiconductor substrate from the conductive pad to a second surface and define a side wall. The liner may coat the side wall and the plug may fill the opening. A second opening may be formed through the semiconductor device and the opening and a conductive material plated therein.

8 Claims, 19 Drawing Sheets

(51) Int. Cl.
*H01L 23/00* (2006.01)
*H01L 23/48* (2006.01)
*H01L 25/065* (2023.01)

(52) U.S. Cl.
CPC .............. *H01L 24/08* (2013.01); *H01L 24/32* (2013.01); *H01L 24/83* (2013.01); *H01L 25/0657* (2013.01); H01L 2224/08146 (2013.01); H01L 2224/32145 (2013.01); H01L 2224/8319 (2013.01); H01L 2225/06541 (2013.01)

(56) References Cited

U.S. PATENT DOCUMENTS

| | | | | |
|---|---|---|---|---|
| 2008/0164573 | A1* | 7/2008 | Basker | H01L 21/486 257/E23.09 |
| 2008/0284037 | A1* | 11/2008 | Andry | H01L 23/49833 257/774 |
| 2010/0013073 | A1* | 1/2010 | Andry | H01L 21/76898 257/774 |
| 2010/0171218 | A1* | 7/2010 | Aoi | H01L 21/76898 257/E21.597 |
| 2010/0264551 | A1* | 10/2010 | Farooq | H01L 25/50 438/109 |
| 2011/0140126 | A1* | 6/2011 | Gaul | H01L 23/3677 257/77 |
| 2021/0111102 | A1* | 4/2021 | Gambino | H01L 25/50 |
| 2021/0134705 | A1* | 5/2021 | Ma | H01L 25/50 |
| 2021/0305226 | A1* | 9/2021 | Tsai | H01L 25/16 |
| 2021/0407891 | A1* | 12/2021 | Ma | H01L 21/76898 |
| 2023/0260875 | A1* | 8/2023 | Zhou | H01L 21/76877 257/774 |
| 2023/0260876 | A1* | 8/2023 | Zhou | H01L 23/481 257/686 |
| 2023/0260877 | A1* | 8/2023 | Zhou | H01L 23/481 257/686 |
| 2023/0260964 | A1* | 8/2023 | Zhou | H01L 25/0657 257/777 |
| 2023/0352413 | A1* | 11/2023 | Sheng | H01L 21/76802 |
| 2024/0063183 | A1* | 2/2024 | Elsherbini | H01L 25/16 |

FOREIGN PATENT DOCUMENTS

| | | | | |
|---|---|---|---|---|
| WO | WO-2010035375 | A1 * | 4/2010 | ....... H01L 21/76898 |
| WO | WO-2021119924 | A1 * | 6/2021 | |

OTHER PUBLICATIONS

U.S. Appl. No. 17/670,393—Unpublished Patent Application to Wei Zhou et al., filed Feb. 11, 2022, titled "Monolithic Conductive Cylinder In A Semiconductor Device And Associated Methods", 44 pages.

U.S. Appl. No. 63/309,469—Unpublished Provisional Patent Application to Wei Zhou et al., filed Feb. 11, 2022, titled "Monolithic Conductive Columns In A Semiconductor Device And Associated Methods", 45 pages.

* cited by examiner

MONOLITHIC CONDUCTIVE COLUMN IN A SEMICONDUCTOR DEVICE AND ASSOCIATED METHODS

CROSS-REFERENCE TO RELATED APPLICATIONS

This application contains subject matter related to a concurrently-filed U.S. Patent Application by Wei Zhou et al. titled "MONOLITHIC CONDUCTIVE COLUMN IN A SEMICONDUCTOR DEVICE AND ASSOCIATED METHODS." The related application is assigned to Micron Technology, Inc., and is identified as U.S. application Ser. No. 17/670,391. The subject matter thereof is incorporated herein by reference thereto.

This application contains subject matter related to a concurrently-filed U.S. Patent Application by Wei Zhou et al. titled "MONOLITHIC CONDUCTIVE CYLINDER IN A SEMICONDUCTOR DEVICE AND ASSOCIATED METHODS." The related application is assigned to Micron Technology, Inc., and is identified by as U.S. application Ser. No. 17/670,393. The subject matter thereof is incorporated herein by reference thereto.

This application contains subject matter related to a concurrently-filed U.S. Patent Application by Wei Zhou et al. titled "MONOLITHIC CONDUCTIVE COLUMNS IN A SEMICONDUCTOR DEVICE AND ASSOCIATED METHODS." The related application is assigned to Micron Technology, Inc., and is identified as U.S. Application No. 63/309,469. The subject matter thereof is incorporated herein by reference thereto.

TECHNICAL FIELD

The present disclosure is generally related to systems and methods for semiconductor devices. In particular, the present technology relates to semiconductor devices having monolithic conductive columns in electric communication with dies in the semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting semiconductor assemblies. To meet these demands, semiconductor die manufacturers often stack multiple semiconductor dies vertically on top of each other to increase the capacity or performance of a microelectronic device within the limited area on a circuit board or other element to which the semiconductor dies and/or assemblies are mounted.

One method semiconductor die manufacturers attempt to reduce semiconductor device assembly volume is by reducing the bond line thickness. However, this reduction can cause problems with bonds between the dies. For example, with conventional dies, a conductive column within each die is provided to electrically interconnect the dies together. Given the extremely small scale of semiconductor dies, these conductive columns can easily be under- or overfilled with conductive material. When underfilled, a concave recess forms at the top of the column within the conductive material sunken from an exterior surface of the die. This concave recess may lead to ineffective bonding between dies when soldered together. When overfilled, a convex protrusion of conductive material forms at the top of the column extending out from the exterior surface of the die. This convex protrusion may similarly lead to ineffective bonding between dies when soldered together or die separation (e.g., dies bonded together separating from one another). These issues are compounded by the conductive material expanding or generating stress, pressure, or other forces against the adjacent die as the conductive material cools, solidifies, crystallizes, or undergoes a similar post-manufacturing settling phase.

Figure 1:
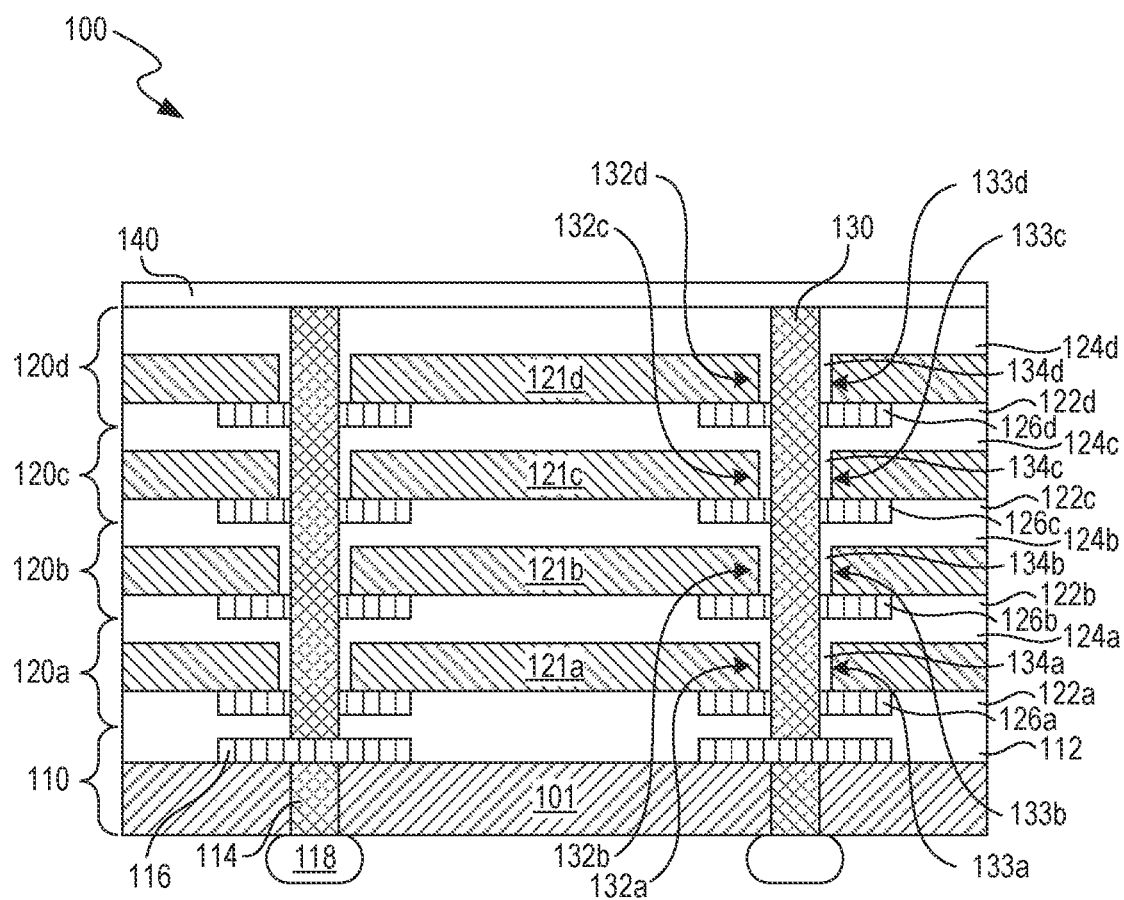
FIG. 1 is a cross-sectional view of a semiconductor device assembly with monolithic conductive columns extending through dies in accordance with some embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below.

DETAILED DESCRIPTION

Overview

A semiconductor device having monolithic conductive columns, and associated assemblies and methods, are disclosed herein. The semiconductor device includes a semiconductor substrate, a conductive pad, an opening, a non-conductive liner, a plug of non-conductive material, and a first and second dielectric layer. The semiconductor substrate has a first surface and a second surface opposite the first surface. The conductive pad is at the first surface of the semiconductor substrate. The opening extends through the semiconductor substrate from the conductive pad at the first surface to the second surface and defines an opening side wall. The non-conductive liner coats the opening side wall from the first surface to the second surface of the semiconductor substrate. The plug of non-conductive material fills the opening from the first surface to the second surface of the semiconductor substrate. The first dielectric layer covers the first surface of the semiconductor substrate and the conductive pad, and the second dielectric layer covers the second surface of the semiconductor substrate, the liner, and the plug.

The semiconductor device may be incorporated into a semiconductor device assembly including a base die, a plurality of the semiconductor devices, and a monolithic conductive column. The base die has a base semiconductor substrate with an upper surface, a base conductive pad on the upper surface, and a base dielectric layer over the base conductive pad and the upper surface. The plurality of semiconductor devices each include the semiconductor substrate, the conductive pad, the opening, the non-conductive liner, and the first and second dielectric layers, and are stacked over the base die with each opening of the plurality of semiconductor devices vertically aligned with the base conductive pad. The monolithic conductive column extends from the base conductive pad through the opening of each of the plurality of semiconductor devices and is in electric communication with each of the semiconductor devices through their respective conductive pads.

The semiconductor device assembly may be manufactured by preparing the base die and the plurality of semiconductor devices, consecutively stacking the plurality of semiconductor devices over the base die, bonding the newly stacked semiconductor devices to the previously stacked semiconductor device, forming an opening through the semiconductor devices extending through the conductive pads of each of the plurality of semiconductor devices, and forming a conductive material within the opening.

For ease of reference, the semiconductor device assembly and device and the components therein are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the stacked semiconductor device and the components therein can be moved to, and used in, different spatial orientations without changing the structure and/or function of the disclosed embodiments of the present technology.

Description of the Figures

FIG. 1 is a cross-sectional view of a semiconductor device assembly 100 ("assembly 100") with monolithic conductive columns 130 extending through and in electric communication with semiconductor dies 110, 120a-d in accordance with some embodiments of the present technology. In the illustrated embodiment, the assembly 100 includes (i) a base die 110, (ii) four semiconductor dies 120a-d (collectively "dies 120a-d," individually die 120a, 120b, 120c, or 120d) over the base die 110, (iii) a cover layer 140 with a bottom surface over the die 120d, and (iv) two monolithic conductive columns 130 (e.g., assembly through-substrate vias, "assembly TSVs 130") extending from the bottom surface of the cover layer 140 to the base die 110. In some embodiments, the assembly 100 may exclude the base die 110 or the base die 110 may be replaced with a die generally corresponding with the dies 120a-d. In some embodiments, the assembly 100 may include additional (e.g., 5, 6, etc.) or fewer (e.g., 2 or 3) dies generally corresponding with the dies 120a-d. Similarly, in some embodiments, the assembly 100 may include additional (e.g., 3, 4, etc.) or a single assembly TSV 130.

As illustrated in FIG. 1, the base die 110 may include (i) a base wafer 101 having a top surface and a bottom surface opposite the top surface, (ii) one or more base conductive pads 116 on the top surface of the base wafer 101, (iii) one or more external through-substrate vias 114 (e.g., structures, "external TSVs 114") extending through the base wafer 101 from the base conductive pads 116 to the bottom surface, and (iv) a base dielectric layer 112 at least partially covering the top surface of the base wafer 101 and the base conductive pads 116. One or more electric connectors 118 may be coupled to the bottom surface of the base wafer 101. The electric connectors 118 may each have a corresponding assembly TSV 130, base conductive pad 116, and external TSV 114 all in a vertical alignment. The base conductive pads 116 may be in electric communication with the corresponding assembly TSV 130 and the external TSV 114, and may further be in electric communication with the electric connectors 118 via the corresponding external TSV 114. The electric connectors 118 may be any device or assembly suitable for providing an external electric connection into the assembly 100.

In some embodiments, the base wafer 101 can include conductive and dielectric materials that can be formed using an additive process, including, but not limited to, sputtering, physical vapor deposition (PVD), electroplating, lithography, or other similar processes. In some embodiments, the base dielectric layer 112 and the cover layer 140 can be formed from a suitable dielectric, non-conductive material such as parylene, polyimide, low temperature chemical vapor deposition (CVD) materials (such as tetraethylorthosilicate (TEOS), silicon nitride ($Si_3Ni_4$), silicon oxide ($SiO_2$)) or other suitable dielectric, non-conductive materials using a similar additive process to the base wafer 101. The base dielectric layer 112 may have a thickness in a vertical dimension of 50 nm, 100 nm, 200 nm, 300 nm, or 400 nm. The base dielectric layer 112 may further have a thickness larger, smaller, or between these values.

In some embodiments, the base conductive pads 116 can be formed from a suitable conductive metal (or metal plating) such as copper, gold, silver, aluminum, tungsten, cobalt, nickel, or any other suitable conductive material formed using an additive process, including, but not limited to, plating, depositing, or any other suitable method of manufacture for forming base conductive pads 116 on the base wafer 101. The base conductive pads 116 may have a thickness in a vertical dimension of 0.8 μm, 1.0 μm, 1.2 μm, or 1.4 μm. The base conductive pads 116 may further have a thickness larger, smaller, or between these values. In some embodiments, the base conductive pads 116 can be formed from the same conductive material and/or different conductive materials, or may have the same or different thicknesses. For example, in some embodiments, some base conductive pads 116 may be formed from copper while other base conductive pads 116 are formed from gold. The copper construction of some base conductive pads 116 can help reduce manufacturing costs while the gold construction of other base conductive pads 116 can help improve the conductivity of the base conductive pads 116.

The dies 120a-d, as illustrated in FIG. 1 and in reference to a generalized semiconductor die 120, each may include (i) a die wafer 121 having a top surface and a bottom surface opposite the top surface, (ii) die openings 132 in the die wafer 121 extending from the top surface to the bottom surface and defining die opening walls 133, (iii) liners 134 on the die opening walls 133, (iv) one or more die conductive pads 126 on the bottom surface of the die wafer 121 and each in vertical alignment with a corresponding die opening 132, (v) a bottom (e.g., lower) dielectric layer 122 on the bottom surface of the die wafer 121 and at least partially covering the bottom surface and the die conductive pads 126, and (vi) a top (e.g., upper) dielectric layer 124 on the top surface of the die wafer 121 at least partially covering the top surface. The die openings 132, within the liners 134, may be filled by a portion of a corresponding assembly TSV 130 extending through the die 120 in alignment with the die opening 132 and the die conductive pad 126. The assembly TSVs 130 may be in electric communication with the corresponding die conductive pad 126 and further in electric communication with the corresponding die wafer 121 via its respective die conductive pad 126. In some embodiments, the die conductive pad 126 may be on the top surface of the die wafer 121, or at least one die conductive pad 126 may be on each of the top and the bottom surfaces of the die wafer 121, respectively.

The dies 120a-d may be consecutively stacked over the base die 110 and bonded to the assembly 100 with their die openings 132a-d in alignment with a corresponding base conductive pad 116. In this arrangement, the assembly TSV 130 may extend through the assembly 100 along the die openings 132a-d until contacting the corresponding base conductive pad 116. The die 120a (e.g., first or bottom die) may be stacked and bonded to the base die 110 with the die openings 132a in vertical alignment with the corresponding base conductive pads 116. The die 120b (e.g., second die) may be stacked and bonded to the die 120a with the die openings 132b in vertical alignment with the corresponding die openings 132a and base conductive pads 116. The die 120c (e.g., third die), the die 120d (e.g., fourth or top die), and one or more additional dies 120 may similarly be stacked and bonded to the assembly 100 with their die openings 132c, 132d vertically aligned with corresponding lower die openings 132a, 132c and base conductive pads 116. In some embodiments, bonding of two dies (e.g., base die 110, dies 120a-d) may utilize a direct bonding process between opposing dielectric layers (e.g., base dielectric layer 112, top and bottom dielectric layers 122a-d, 124a-d) of the dies. In some embodiments, any alternative, suitable bonding process may be used to bond opposing dielectric layers. For example, the bottom dielectric layer 122b of the die 120b may be directly bonded to the top dielectric layer 124a of the die 120a with the die openings 132a, 132b in vertical alignment.

Figure 3:
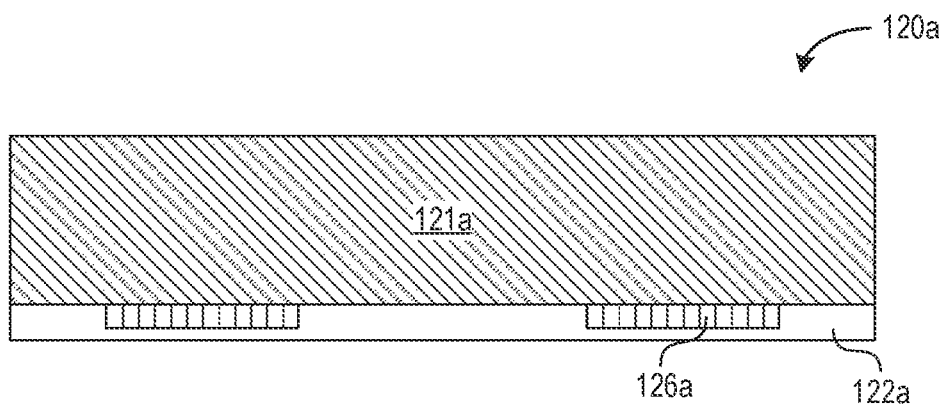
FIGS. 3-18B illustrate a process for producing a semiconductor device assembly with monolithic conductive columns extending through dies in accordance with some embodiments of the present technology.

The die wafer 121 can be generally similar to the base wafer 101 in construction and material composition. The die wafer 121 can have a preparation state and an assembly state. In the assembly state (as shown in FIG. 1) the die wafer 121 has a thickness in a vertical direction smaller than when in the preparation state (as shown in FIG. 3). In the assembly state, the die wafer 121 may have a thickness in a vertical dimension of 8 µm, 10 µm, 12 µm, or 14 µm, or any thickness larger, smaller, or between these values. Additionally, the top and bottom dielectric layers 122, 124 and the die conductive pads 126 can generally be similar to the base dielectric layer 112 and the base conductive pads 116, respectively, in construction and material composition. In some embodiments, the dielectric layers (e.g., base dielectric layer 112, cover layer 140, top and bottom dielectric layers 122, 124) and the conductive pads (e.g., base conductive pads 116, die conductive pads 126) can have the same construction and material composition, respectively. In other embodiments, only some dielectric layers or some conductive pads can have the same construction and material composition, respectively. In other embodiments, the dielectric layers or the conductive pads can all have a different construction and material composition, respectively.

The assembly TSVs 130 may be a single elongated piece of conductive material (e.g., monolithic conductive column) extending from each base conductive pad 116 and through the dies 120a-d to the bottom side of the cover layer 140. To achieve this structure, the assembly TSVs 130 may be manufactured into the assembly 100 in a single manufacturing step, such as a single plating operation (discussed in detail in reference to FIGS. 15 and 16) after the dies 120a-d are consecutively bonded to the assembly 100 and the assembly openings 138 (FIG. 15) etched therein. Using this assembly and manufacturing method, each assembly TSV 130 may be in electric communication with the base die 110 via the corresponding individual base conductive pad 116 and in electric communication with the dies 120a-d via the corresponding die conductive pads 126a-d, respectively. Each assembly TSV 130 may further be in electric communication with a corresponding external TSV 114 and electric connectors 118 via the corresponding base conductive pad 116.

In some embodiments, the assembly TSVs 130 and the external TSVs 114 can be formed from a suitable conductive metal (or metal plating) such as copper, gold, silver, aluminum, tungsten, cobalt, nickel, or any other suitable conductive material formed using an additive process, including, but not limited to, plating, depositing, or any other suitable manufacturing method for forming the assembly TSVs 130 within an elongated opening formed in the assembly 100 after the dies 120a-d are bonded to the assembly 100 and for forming the external TSVs 114 within openings formed in the base wafer 101.

Figure 2:
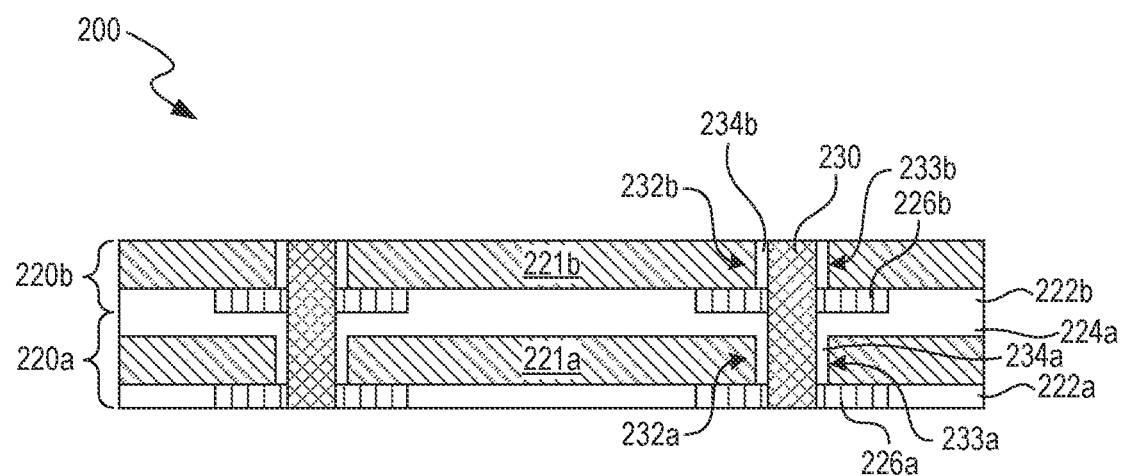
FIG. 2 is a cross-sectional view of a semiconductor device with monolithic conductive columns extending through two dies in accordance with some embodiments of the present technology.

FIG. 2 is a cross-sectional view of a semiconductor device 200 ("device 200") with two monolithic conductive columns 230 extending through and in electric communication with semiconductor dies 220a, 220b in accordance with some embodiments of the present technology. One or more devices 200 may be implemented within the assembly 100, as described in reference to FIG. 1. Additionally or alternatively, one or more devices 200 may be implemented within a semiconductor device assembly generally similar to the assembly 100 or a semiconductor device assembly including all, some, or similar elements as the assembly 100. In the illustrated embodiment, the device 200 includes a first die 220a and a second die 220b ("dies 220a, 220b") and two monolithic conductive columns 230 (e.g., device through-substrate vias, "device TSVs 230"). Elements of the device 200 may correspond with similar elements of the assembly 100 and may be generally similar in structure and material composition. The method for manufacturing the device 200 may similarly correspond, in whole or in part, with the method for manufacturing the assembly 100 (illustrated and further described regarding FIGS. 3-18B). In some embodiments, the device 200 may include additional (e.g., 3, 4, etc.) dies generally corresponding with the dies 220a, 220b. In some embodiments, the device 200 may include additional (e.g., 3, 4, etc.) or a single device TSV 230.

As similarly discussed regarding assembly 100 and referencing a generalized semiconductor die 220, the dies 220a, 220b each may include (i) a die wafer 221 having a top surface and a bottom surface opposite the top surface, (ii) die openings 232 in the die wafer 221 extending from the top surface to the bottom surface and defining die opening walls 233, (iii) liners 234 on the die opening walls 233, (iv) one or more die conductive pads 226 on the bottom surface of the die wafer 221 each in vertical alignment with a corresponding die opening 232, and (v) the bottom dielectric layer 222 on the bottom surface of the die wafer 221 and at least partially covering the bottom surface and the die conductive pads 226. The first die 220a may further include a top dielectric layer 224a on the top surface of the die wafer 221a. The die openings 232, within the liners 234, may be filled by a portion of a corresponding device TSV 230 extending through the die 220 in alignment with the die opening 232 and the die conductive pad 226. The device TSV 230 may be in electric communication with the corresponding die conductive pad 226 and further be in electric communication with the corresponding die wafer 221 via the conductive pad 226. In some embodiments, the die conductive pads 226 may be on the top surface of the die wafer 221 or the die conductive pads 226 may be on both the top and bottom surfaces of the die wafer 221.

The second die 220b may be stacked and bonded to the first die 220a with the die openings 232b in vertical alignment with corresponding die openings 232a. In this arrangement, device TSVs 230 may extend through the dies 220a, 220b and be a single elongated piece of conductive material (e.g., monolithic conductive column) formed in a single manufacturing step such as a single plating operation (discussed in detail in reference to FIGS. 15 and 16). Each device TSV 230 may be in electric communication with the dies 220a, 220b via the corresponding die conductive pads 226a, 226b, respectively.

The assembly TSVs 130 and the device TSVs 230, and the assembly 100 and the device 200 generally, provide benefits over conventional structures within semiconductor assemblies. In conventional semiconductor dies, TSVs are formed within each die. When these conventional dies are bonded into a semiconductor die or device assembly, additional conductive material (e.g., solder) must be used to connect the TSVs of adjacent dies to create electric communication therebetween. As previously discussed, some TSVs may be underfilled or overfilled, creating a concave recess or convex protrusion, respectively, where the TSVs meet an exterior surface of the die. When a recess is present, a manufacturer may unknowingly use insufficient additional conductive material to connect the TSVs of adjacent dies and create ineffective connections and inoperative semiconductor die assemblies. When a protrusion is present, a manufacturer may unknowingly use too much additional conductive material to connect the TSVs of adjacent dies and cause the adjacent dies to separate near the excess material, leading to ineffective connections or semiconductor die assembly failure due to die separation.

In contrast, the assembly TSVs 130 and the device TSVs 230 are, for example, manufactured into the assembly 100 or device 200 after dies 120a-d, 220a, 220b, respectively, are bonded together. This method eliminates the need for the additional conductive material (e.g., solder) to connect TSVs of adjacent dies. Underfill and overfill and their respective negative outcomes are therefore avoided because only one TSV is required for multiple dies. This method further provides the benefit of distributing stress, pressure, or other forces generated by the cooling, solidification, crystallization, or similar post-manufacturing settling processes within or along the length of the TSV.

FIGS. 3-18B illustrate a process for producing the assembly 100 having assembly TSVs 130 extending through and in electric communication with the base die 110 and the dies 120a-d in accordance with some embodiments of the present technology. The process may, generally, include (i) preparing the die 120a, (ii) bonding the die 120a to the base die 110, (iii) thinning the die wafer 121a, (iv) cutting die openings 132a into the die wafer 121a (defining the die opening walls 133a), (v) adding liners 134a to the die opening walls 133a, (vi) adding plugs 136a within the die openings 132a, (vii) adding the top dielectric layer 124a, (viii) repeating steps (i)-(vii) to consecutively prepare, bond, and modify the dies 120b-d of the assembly 100, (ix) adding a photo resistive layer 150 over the die 120d, (x) cutting assembly openings 138 into the assembly 100, (xi) forming the assembly TSVs 130 in the assembly openings 138, (xii) removing the photo resistive layer 150, (xiii) adding the cover layer 140, and (xiv) adding the external TSVs 114 and electric connectors 118. The process for producing the device 200 may include all, some, or similar elements to the process summarized above and described below regarding FIGS. 3-18B and can be used, for example, to prepare and bond the dies 220a, 220b of the device 200 and form the device TSVs 230 therein.

FIG. 3 illustrates the die 120a after bonding the die conductive pads 126a to the bottom surface of the die wafer 121a and applying the bottom dielectric layer 122a at least partially covering the bottom surface of the die wafer 121a and the die conductive pads 126a. As illustrated, the die wafer 121a is in a preparation state where the die wafer 121a is prepared for bonding to the base die 110. In the preparation state, the die wafer 121a may be thicker in a vertical dimension than the die wafer 121a in the assembly state (as shown in FIG. 1), for example, for ease of handling during manufacturing. The bottom dielectric layer 122a may act to insulate the bottom surface of the die wafer 121a and the die conductive pads 126a.

Figure 4:
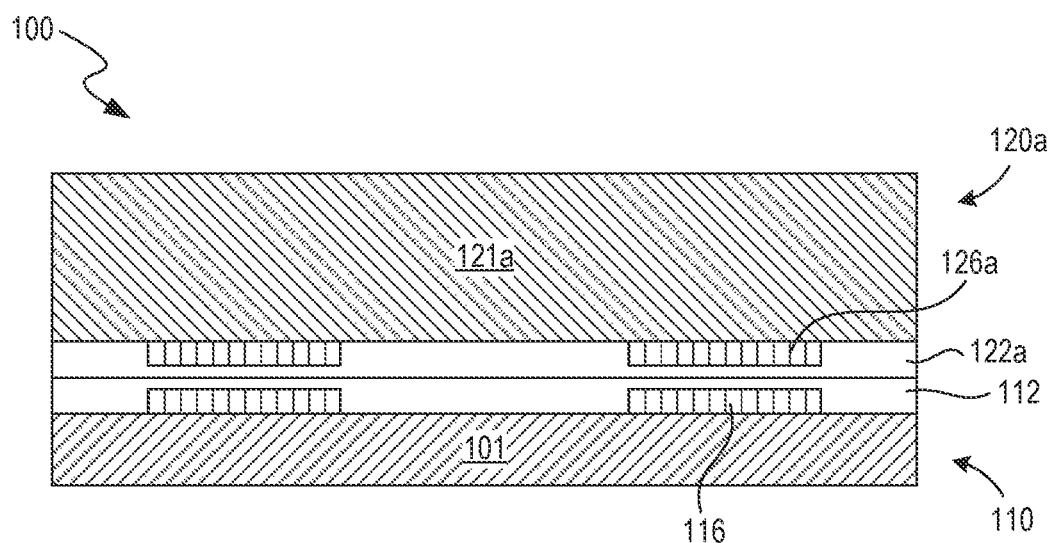

FIG. 4 illustrates the assembly 100 after the die 120a is bonded with the base die 110. The die 120a may be bonded with the base die 110 by bonding the bottom dielectric layer 122a to the base dielectric layer 112. When the die 120a is bonded to the base die 110, the die conductive pads 126a may be placed in vertical alignment with corresponding base conductive pads 116. As illustrated, the base die 110 may be insulated from the die 120a by the base dielectric layer 112 and the bottom dielectric layer 122a.

Figure 5:
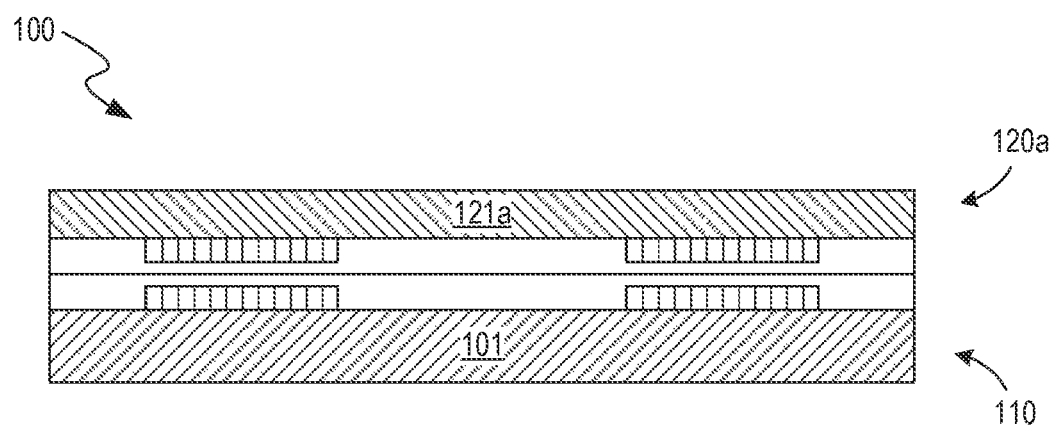

FIG. 5 illustrates the assembly 100 after the die wafer 121a is thinned from the preparation state thickness (FIGS. 3 and 4) to the assembly state thickness. The die wafer 121a may be thinned using a suitable mechanical or chemical semiconductor wafer thinning process.

Figure 6:
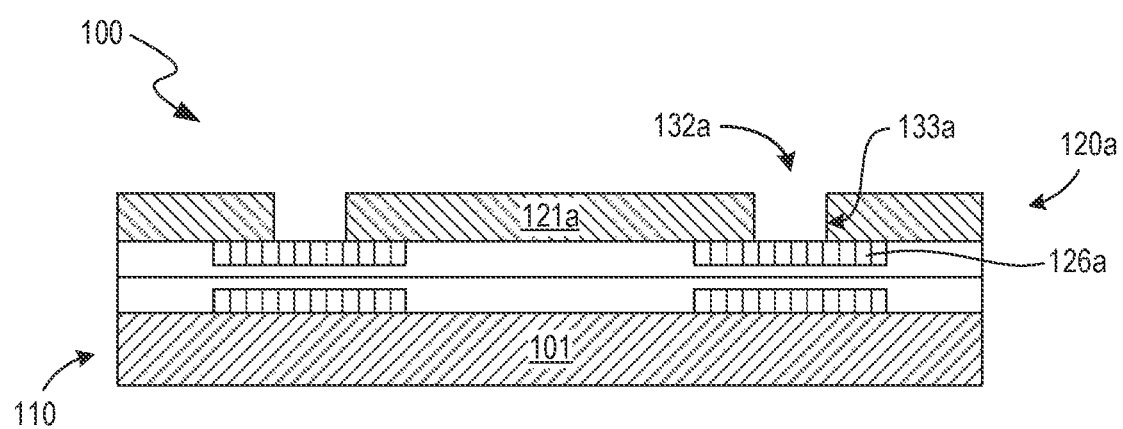

FIG. 6 illustrates the assembly 100 after the die openings 132a are cut into the die wafer 121a. As illustrated, the die openings 132a may extend from the top surface of the die wafer 121a to the bottom surface of the die wafer 121a and a top surface of the die conductive pads 126a and may define die opening walls 133a. The die openings 132a may have a substantially circular cross-section, providing a void in the die wafer 121a. In some embodiments, a diameter of the circular cross-section may be the same for all of the die openings 132a. In other embodiments, the diameter may vary for some or all of the die openings 132a. In some embodiments, the cross-section of the die openings 132a may be noncircular. For example, but not as a limitation thereto, the cross-section may be a square, a rectangle, or any other shape providing the die opening walls 133a and a void in the die wafer 121a. The die openings 132a may by etched into the die wafer 121a or may be formed using any suitable mechanical or chemical process for cutting the die openings 132a into the die wafer 121a.

Figure 7:
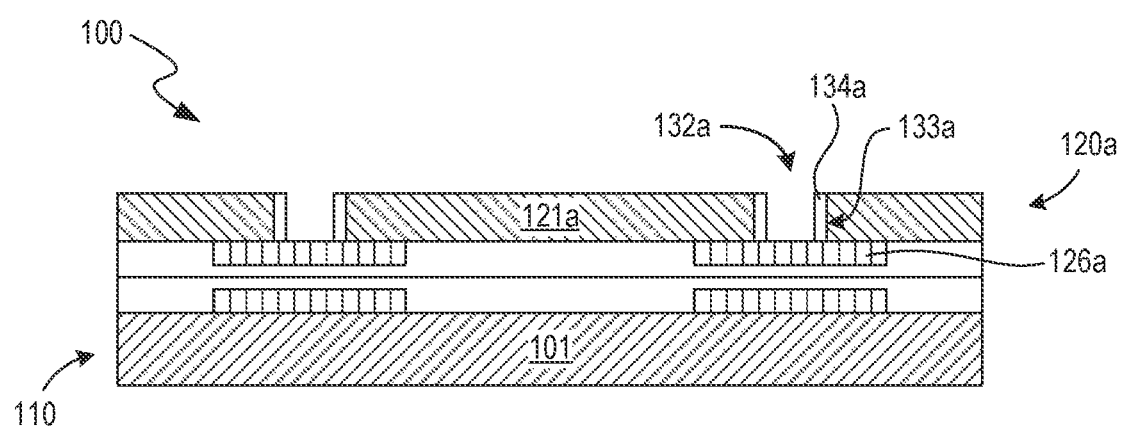

FIG. 7 illustrates the assembly 100 after the liners 134a are applied to the die opening walls 133a. The liners 134a may be applied to the die opening walls 133a using any suitable additive manufacturing processes that may adhere the liners 134a to the die opening walls 133a to achieve a radial thickness into the die openings 132a of 0.8 μm, 1.0 μm, 1.2 μm, or 1.4 μm. The liners 134a may further have a thickness larger, smaller, or between these values. The liners 134a may comprise any non-conductive, dielectric material that may bond with the die wafer 121a at the die opening walls 133a. As illustrated, the liners 134a may fill a portion of the die openings 132a radially inward from the die opening walls 133a and insulate the die wafer 121a from the remainder of the die openings 132a.

Figure 8:
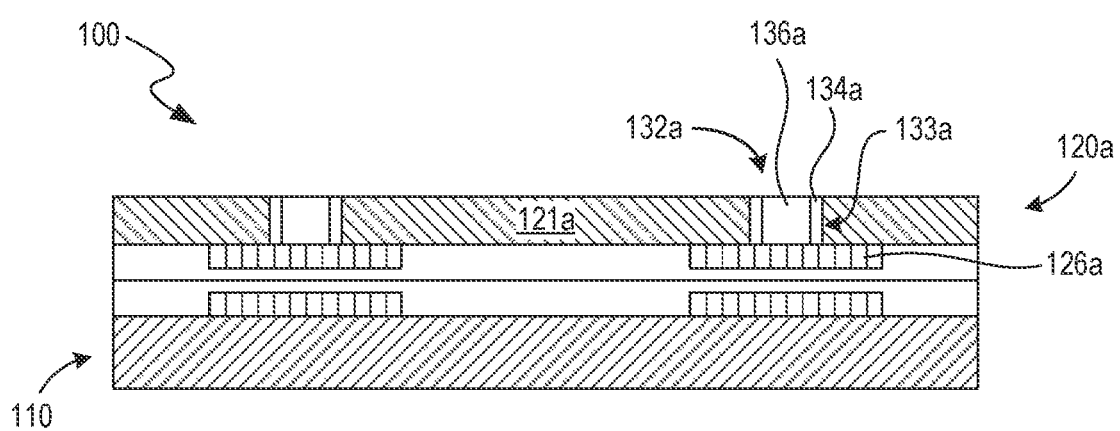

FIG. 8 illustrates the assembly 100 after the plugs 136a are applied within the remainder of the die openings 132a. The plugs 136a may be applied using any suitable additive manufacturing process for applying the plugs 136a within the die openings 132a from the top surface of the die conductive pads 126a to the top surface of the die wafer 121a. The plugs 136a may be any suitable non-conductive, easily etchable material that may fill the remainder of the die openings 132a. As illustrated, the plugs 136a insulate the die opening walls 133a and the top surface of the die conductive pads 126a.

Figure 9:
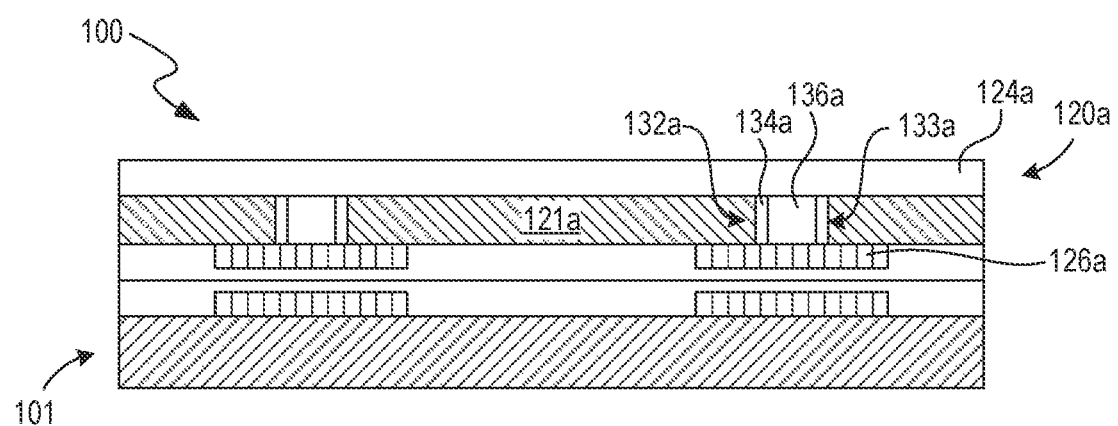

FIG. 9 illustrates the assembly 100 after the top dielectric layer 124a is applied to the top surface of the die wafer 121a, the liners 134a, and the plugs 136a. As illustrated, the top dielectric layer 124a may insulate the top surface of the die wafer 121a, the liners 134a, and the plugs 136a.

Figure 10A:
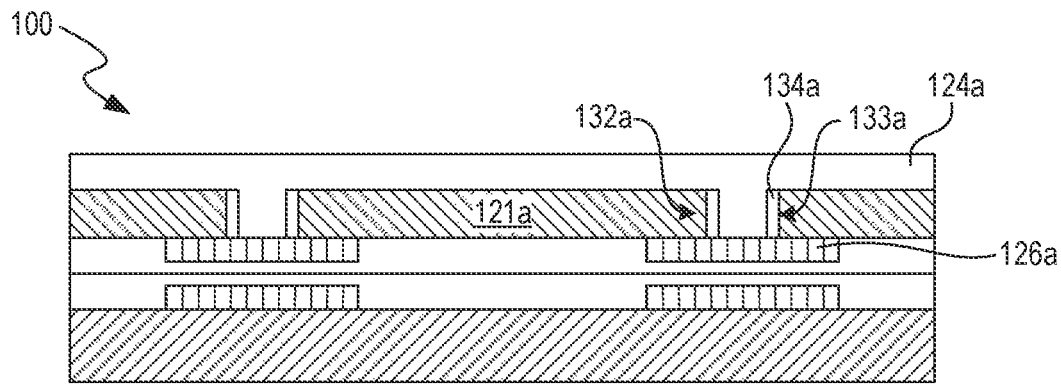
Figure 10B:
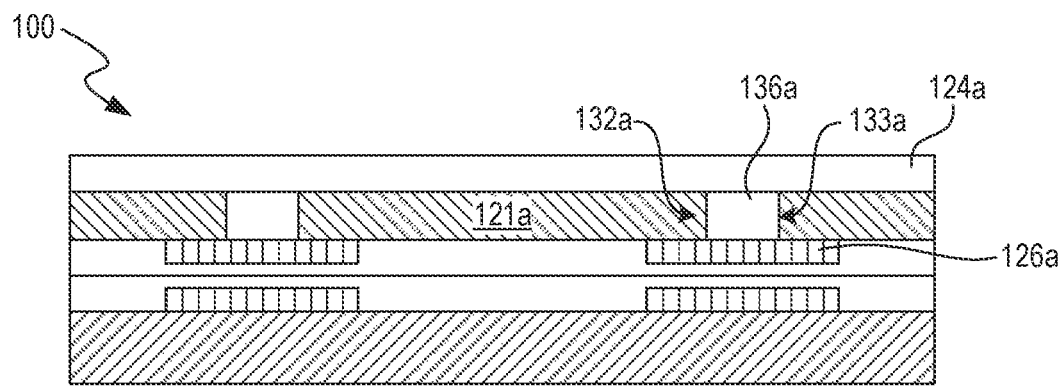
Figure 10C:
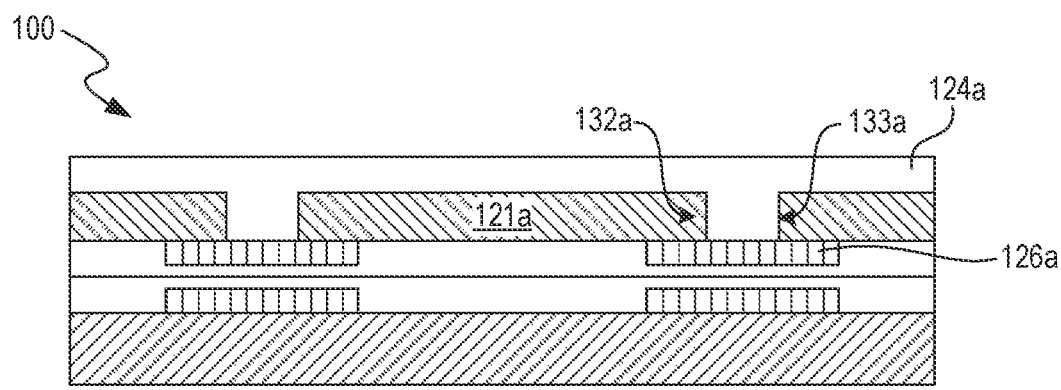

FIGS. 10A-10C illustrate some embodiments of the assembly 100 illustrated in FIG. 9. FIG. 10A illustrates the assembly 100 of FIG. 9 where the plugs 136a are not included. When the plugs 136a are not included, the liners 134a may be applied following the process illustrated in FIG. 7 and the process of FIG. 8 may be skipped. Then the top dielectric layer 124a may be applied on the top surface of the die wafer 121a and to fill the remainder of the die openings 132a. FIG. 10B illustrates the assembly 100 of FIG. 9 where the liners 134a are not included. When the liners 134a are not included, the process illustrated in FIG. 7 may be skipped and the plugs 136a may be applied within the die openings 132a following the process of FIG. 8 and may be in contact with the die opening walls 133a and filling the die openings 132a. The top dielectric layer 124a may then be applied to the top surface of the die wafer 121a and a top surface of the plugs 136a. FIG. 10C illustrates the assembly 100 of FIG. 9 where the liners 134a and the plugs 136a are not included. When the liners 134a and the plugs 136a are not included, the processes of FIGS. 7 and 8 may be skipped and the top dielectric layer 124a may be applied on the top surface of the die wafer 121a and to fill the die openings 132a. In these illustrated embodiments of FIGS. 10A-10C, the top dielectric layer 124a, liners 134a, or plugs 136a, when included in one of the illustrated embodiments, may insulate the die wafer 121a within the die openings 132a.

Figure 11:
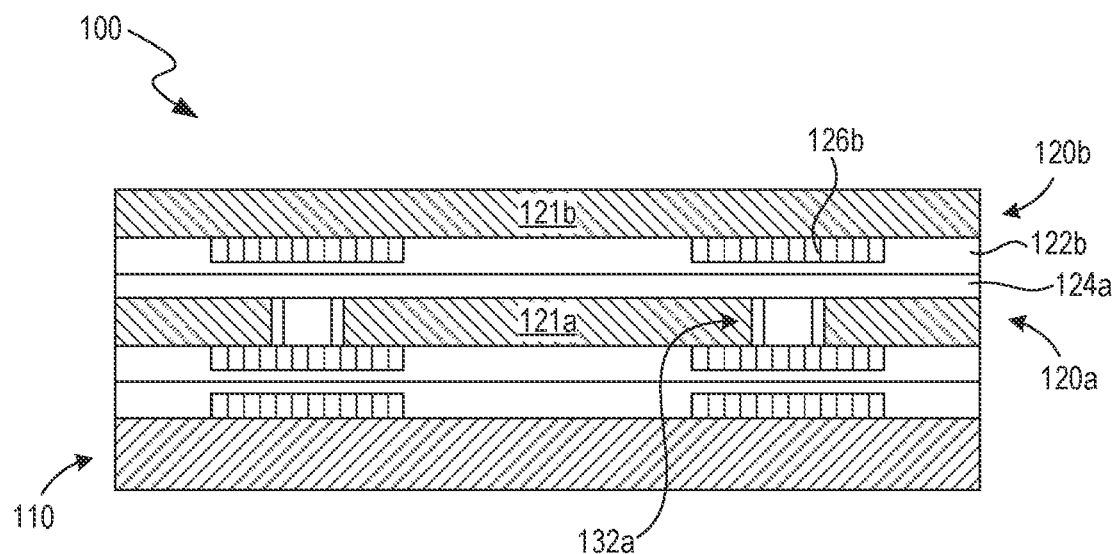

FIG. 11 illustrates the assembly 100 after the die 120b is bonded to the top dielectric layer 124a. The die 120b may be prepared for bonding to the assembly following the process of FIG. 2. Then the die 120b may be bonded to the die 120a by bonding the bottom dielectric layer 122b with the top dielectric layer 124a. When the die 120b is bonded to the die 120a, the die conductive pads 126b may be placed in vertical alignment with corresponding die openings 132a. As illustrated, the die 120a is insulated from the die 120b by the top dielectric layer 124a and the bottom dielectric layer 122b.

Figure 12:
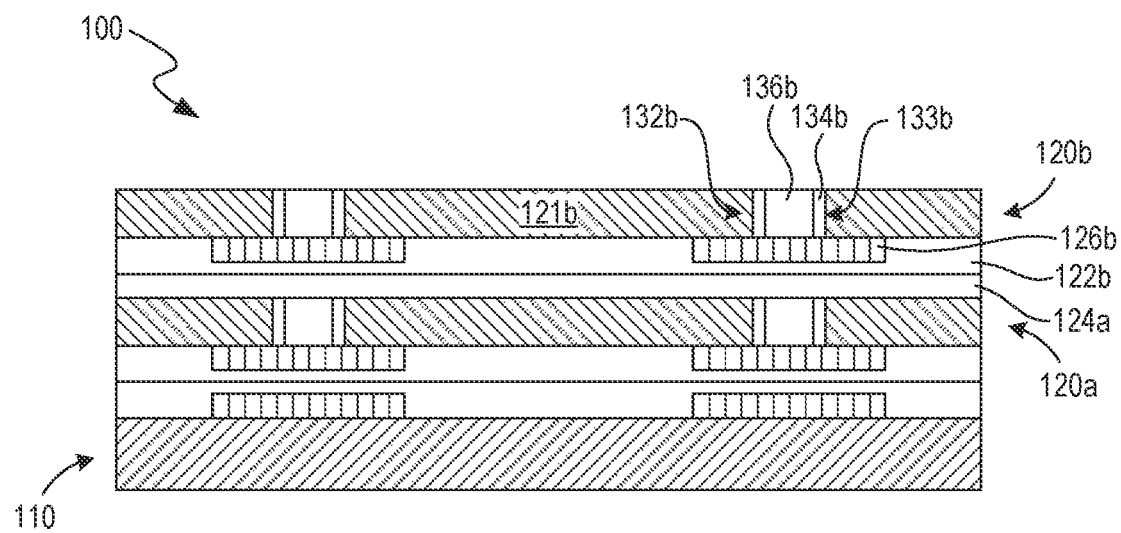

FIG. 12 illustrates the assembly 100 after the liners 134b and the plugs 136b are applied to the die openings 132b cut into the die wafer 121b. The die openings 132b may be cut following the process of FIG. 6, defining die opening walls 133b, and the liners 134b and plugs 136b may be applied following the process of FIGS. 7 and 8, as performed on the die 120a. As illustrated, the liners 134b and the plugs 136b fill the die openings 132b cut into the die wafer 121b and insulate the die wafer 121b and the top surface of the die conductive pad 126b.

Figure 13:
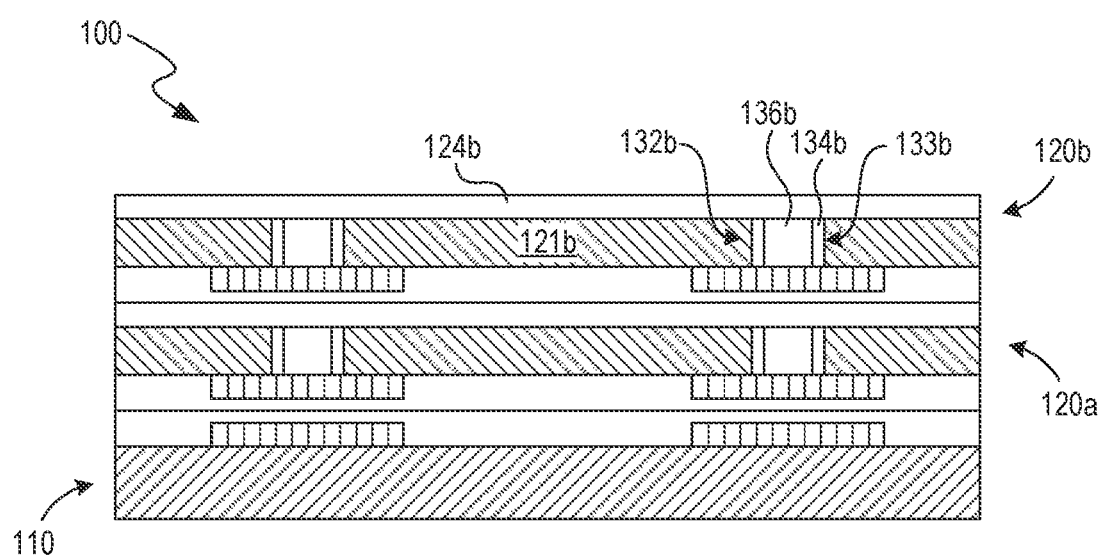

FIG. 13 illustrates the assembly 100 after the top dielectric layer 124b is applied to the top surface of the die wafer 121b, the liners 134b, and the plugs 136b. The top dielectric layer 124b may be applied to the top surface of the die wafer 121b, the liners 134b, and the plugs 136b following the process of FIG. 9. As illustrated, the top dielectric layer 124b insulates the top surface of the die wafer 121b, the liners 134b, and the plugs 136b. In some embodiments, the die 120b may instead correspond with an embodiment illustrated in one of FIGS. 10A-10C, regarding the liners 134b, the plugs 136b, and the top dielectric layer 124b.

Figure 14:
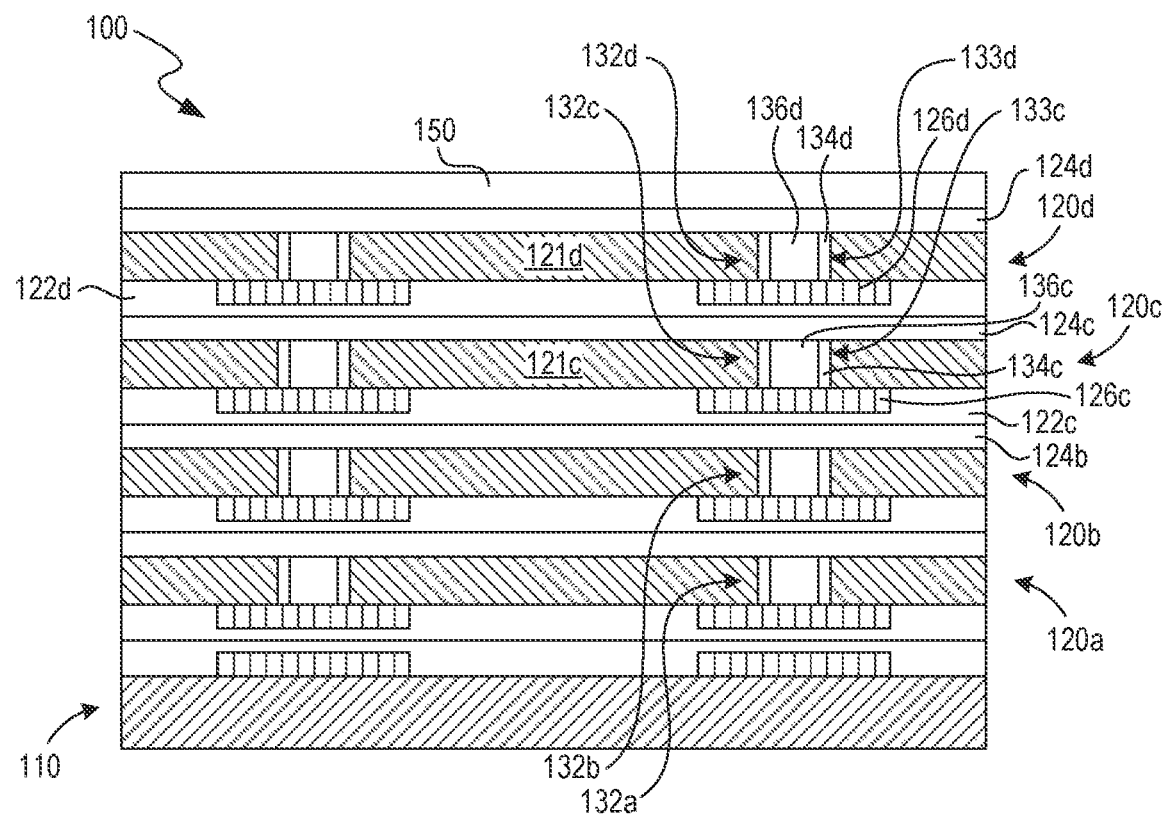

FIG. 14 illustrates the assembly 100 after the die 120c and the die 120d are bonded to the top of the assembly 100, and a photo resistive layer 150 has been applied to the top surface of the die 120d. The die 120c and the die 120d may consecutively (i) be bonded to the assembly 100 following the process of FIG. 11, (ii) have die openings 132c, 132d cut into the die wafer 121c, 121d following the process of FIG. 6, defining die opening walls 133c, d, and (iii) have the liners 134c, 134d and plugs 136c, 136d applied within the die openings 132c, 132d following the process of FIGS. 7 and 8. When the die 120c and the die 120d are bonded to the assembly 100, the die conductive pads 126c, 126d may be placed in vertical alignment with corresponding die openings 132b, 132c. In some embodiments, the die 120c or the die 120d may instead correspond with an embodiment illustrated in one of FIGS. 10A-10C, regarding the liners 134c, 134d, the plugs 136c, 136d, and the top dielectric layers 124c, 124d. As illustrated, the die 120b is insulated from the die 120c by the top dielectric layer 124b and the bottom dielectric layer 122c, and the die 120c is insulated from the die 120d by the top dielectric layer 124c and the bottom dielectric layer 122d.

After the die 120d is bonded to the assembly 100, the photo resistive layer 150 may be applied to the top surface of the dielectric layer 124d. The photo resistive layer 150 may be a protective layer having a top surface and may be made of a polymer or any suitable material for protecting the assembly 100 when the assembly openings 138 (FIG. 15) are etched into the assembly 100. The photo resistive layer 150 may be applied using any suitable additive manufacturing process, including, but not limited to, sputtering, physical vapor deposition (PVD), electroplating, lithography, or other similar processes.

Figure 15:
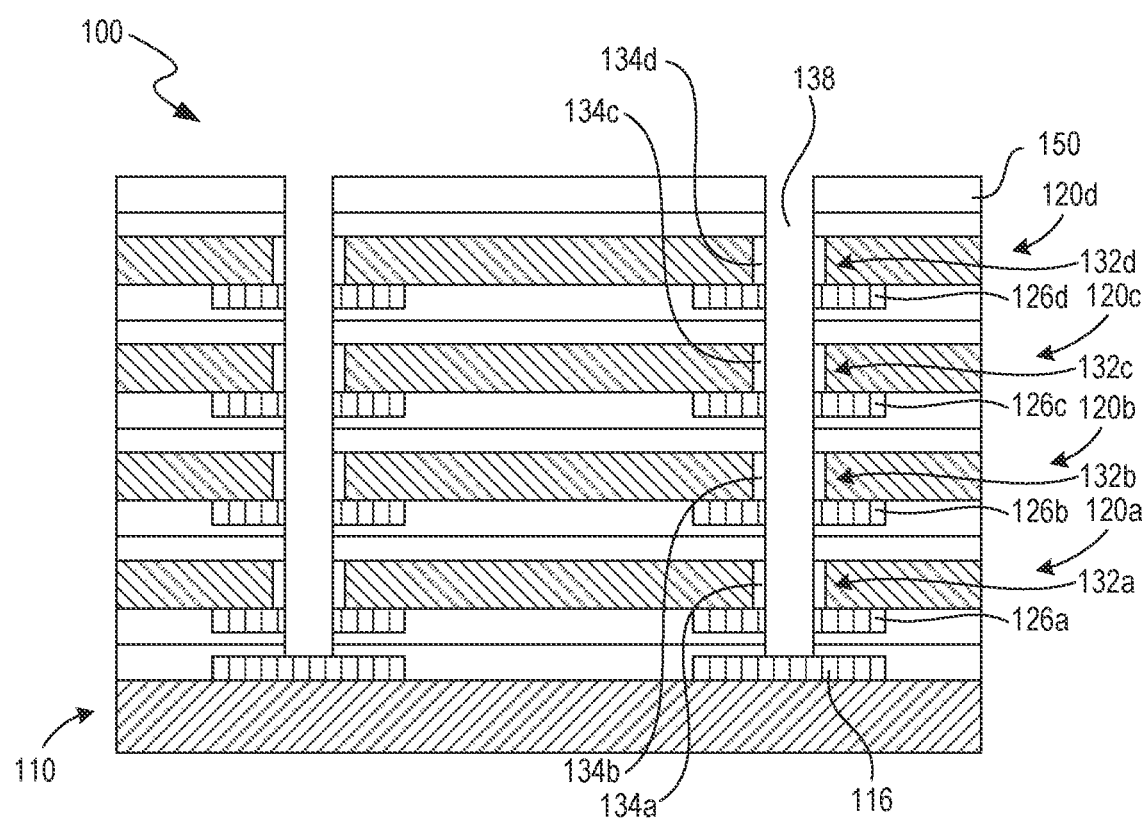

FIG. 15 illustrates the assembly 100 after two assembly openings 138 are etched into the assembly 100. After the dies 120a-d and the photo resistive layer 150 are added to the assembly 100, the assembly openings 138 may be etched into the assembly 100, removing material from the dies 120a-d and providing elongated voids. The assembly openings 138 may have a cross-section corresponding with the cross-section of the die openings 132a-d. For example, when the die openings 132a-d have a substantially circular cross-section, the assembly openings 138 may also have a circular cross-section. When the assembly openings 138 have a circular cross-section, a diameter of the assembly openings 138 may correspond with the thickness of the liners 134a-d such that only plugs 136a-d material is removed from the die openings 132a-d. In some embodiments the diameter may correspond with the thickness of the liners 134a-d such that all plugs 136a-d material is removed and some liners 134a-d material is removed. When the die openings 132a-d have a non-circular cross-section, dimensions of the cross-section of the assembly openings 138 may similarly be non-circular and modified to remove only plugs 136a-d material or to remove all plugs 136a-d material and some liners 134a-d material.

As illustrated, two assembly openings 138 are etched into the assembly 100. In some embodiments, the assembly 100 may include additional (e.g., 3, 4, etc.) or a single assembly opening 138. The assembly openings 138 may extend from the top surface of the photo resistive layer 150 to the top surface of the base conductive pads 116. In some embodiments, the assembly openings 138 may instead extend from the top surface of the photo resistive layer 150 to the top surface of one of the conductive pads 126a-d or a top surface of another structure within the assembly 100. In some embodiments, some assembly openings 138 may extend from the top surface of the photo resistive layer 150 to the top surface of the base conductive pads 116 and some assembly openings 138 may extend from the top surface of the photo resistive layer 150 to the top surface of a structure other than the base conductive pads 116 within the assembly 100.

Figure 16:
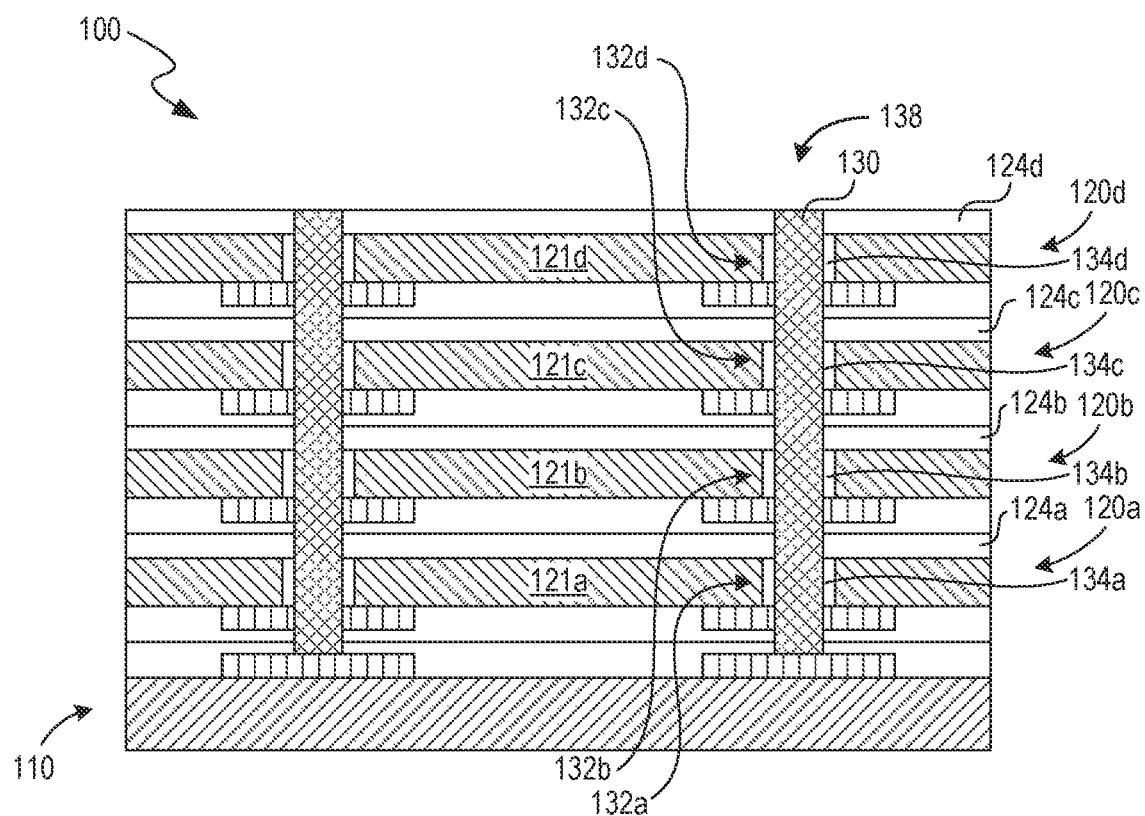

FIG. 16 illustrates the assembly 100 after assembly TSVs 130 have been formed in the assembly openings 138 and the photo resistive layer 150 has been removed. After the assembly openings 138 have been etched into the assembly 100, the assembly TSVs 130 may be formed (e.g., plated) into the assembly openings 138. Once the assembly TSVs 130 are formed, the photo resistive layer 150 and any portion of the assembly TSVs 130 therein may be removed to expose the top dielectric layer 124d and provide a flat, top surface of the assembly 100. The die wafers 121a-d may be insulated from the assembly TSVs 130 by the remainder of the liners 134a-d, respectively. In some embodiments, the liners 134a-d and a portion of the plugs 136a-d (as shown in FIG. 14) may insulate the die wafers 121a-d from the assembly TSVs 130, respectively. When the dies 120a-d correspond with an embodiment illustrated in one of FIGS. 10A-10C, the die wafers 121a-d may instead be insulated from the assembly TSVs 130 by the remainder of the plugs 136a-d or a portion of the top dielectric layers 124a-d, respectively.

Figure 17:
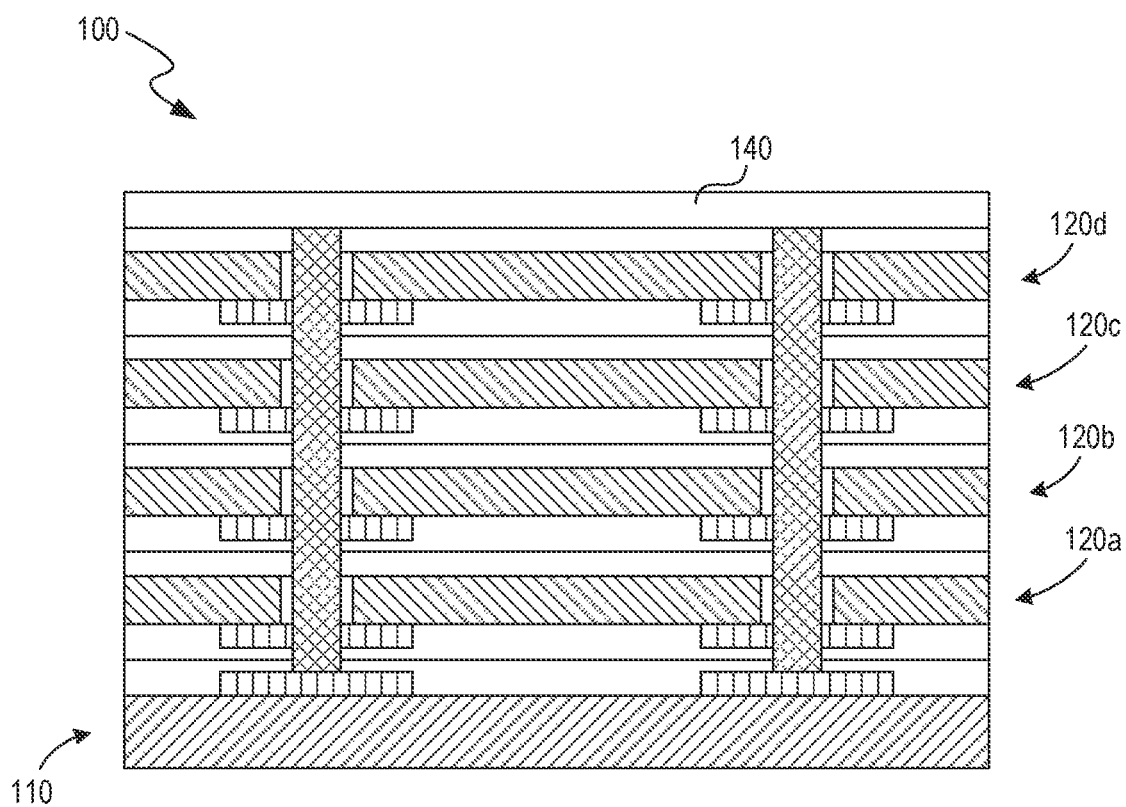

FIG. 17 illustrates the assembly 100 after the cover layer 140 has been applied to the top surface of the assembly 100. As illustrated, the cover layer 140 may insulate the top surface of the assembly 100.

Figure 18A:
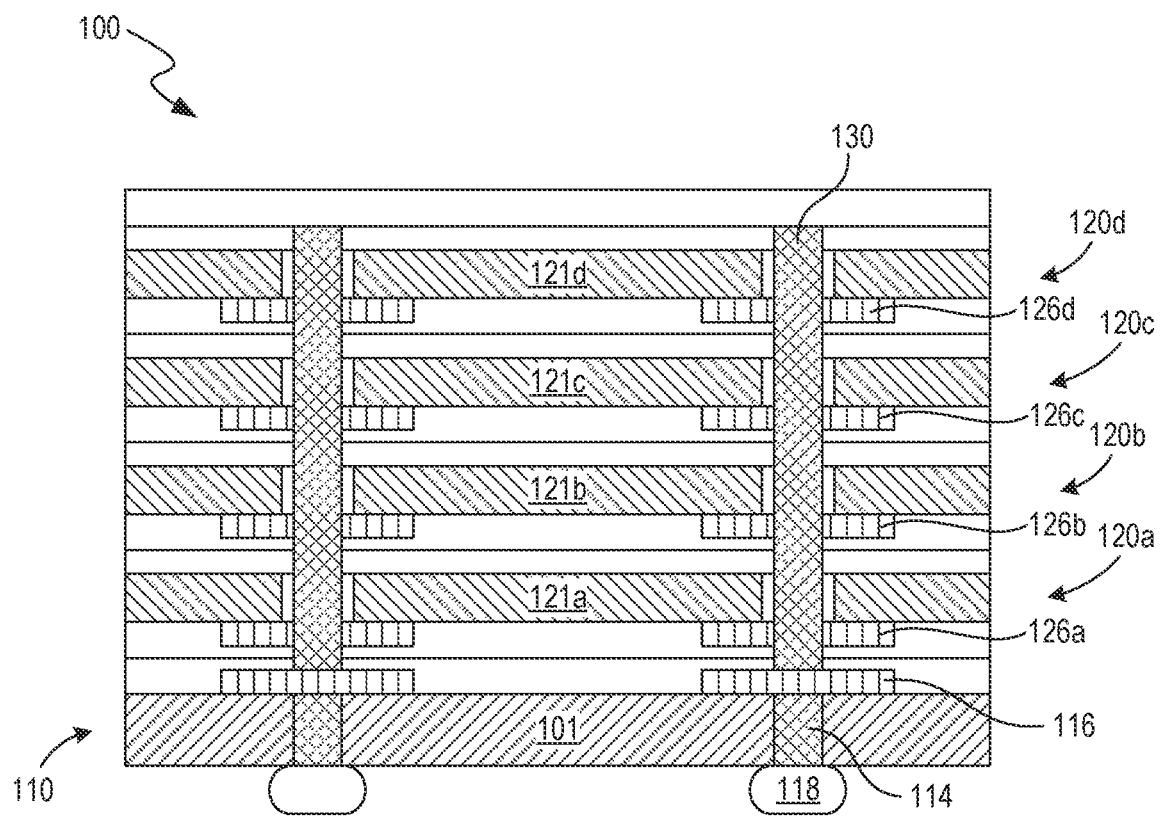
Figure 18B:
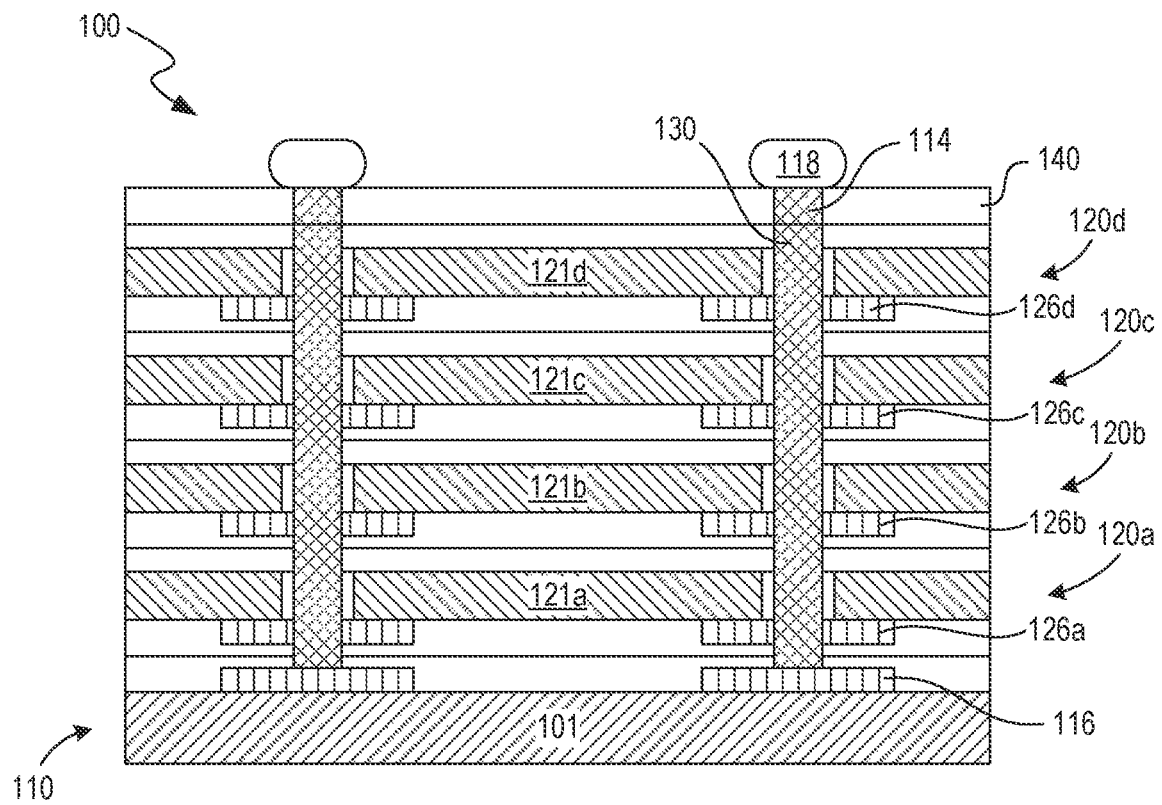

FIGS. 18A and 18B illustrate some embodiments of external TSVs 114 and electric connectors 118 included in the assembly 100. In FIG. 18A, two electric connectors 118 are coupled to the bottom surface of the base die 110 and are each in electric communication with corresponding external TSVs 114. The external TSVs 114 may be formed by etching openings in the base wafer 101 in vertical alignment with a corresponding base conductive pad 116. A conductive material may then be formed in the openings to produce the external TSVs 114. The electric connectors 118 each may then be coupled to the bottom of the base die 110 in vertical alignment with the external TSVs 114, respectively, and in electric communication with the base conductive pads 116 and assembly TSVs 130 via the external TSVs 114. In FIG. 18B, two electric connectors 118 are coupled to a top surface of the cover layer 140 and are each in electric communication with a corresponding external TSVs 114. The external TSVs 114 may be similarly formed as in FIG. 18A by etching openings in the cover layer 140 and adding conductive material therein. Then the electric connectors 118 may each be coupled to the top surface of the cover layer 140 in vertical alignment with the external TSVs 114, respectively, and in electric communication with the assembly TSVs 130 via the external TSVs 114. The electric connectors 118 of FIGS. 18A and 18B may further be in electric communication with the dies 120a-d via the die conductive pads 126a-d and assembly TSV 130. In some embodiments, the assembly 100 may include additional (e.g., 3, 4, etc.) or a single electric connector 118 and corresponding external TSV 114, depending on the number of assembly TSVs 130 within the assembly 100 or whether an application of the assembly 100 requires more or fewer external electric connectors 118.

Conclusion

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:
1. A semiconductor device assembly, comprising:
   a base die, including:
      a semiconductor substrate including an upper surface,
      a base conductive pad at the upper surface, and
      a base dielectric layer disposed over the base conductive pad and the upper surface;
   a plurality of dies, each including:
      a semiconductor substrate including an upper surface and a lower surface,
      a conductive pad at the lower surface having a bottom surface opposite the lower surface,
      a lower dielectric layer disposed over the conductive pad and the lower surface,
      an opening extending through the semiconductor substrate and the conductive pad from the bottom surface to the upper surface, and defining an opening side wall of the semiconductor substrate and a side surface of the conductive pad,
      a non-conductive liner coating the opening side wall, and
      an upper dielectric layer disposed over the upper surface, wherein the plurality of dies is stacked over the base die such that the opening of each of the plurality of dies is vertically aligned with the base conductive pad; and
   a monolithic conductive column extending from the base conductive pad through the opening of each of the plurality of dies and in direct contact with the side surface of the conductive pad of each of the plurality of dies.

2. The semiconductor device assembly of claim 1, wherein the upper dielectric layer of at least one of the plurality of dies has the same material as and integrally formed with the non-conductive liner of the at least one of the plurality of dies.

3. The semiconductor device assembly of claim 1, wherein the non-conductive liner includes an inner surface, wherein the inner surface and the side surface are flush.

4. The semiconductor device assembly of claim 1, wherein the semiconductor substrate of the base die further includes a lower surface opposite the upper surface and the semiconductor device assembly further comprises:
an external connector assembly, including:
an external conductive structure extending through the semiconductor substrate of the base die from the upper surface at the conductive pad to the lower surface, and
an electric connector coupled to the lower surface of the base die semiconductor substrate at the external conductive structure.

5. The semiconductor device assembly of claim 4, wherein the semiconductor device assembly is configured such that the electric connector is in electric communication with each of the plurality of dies via the external conductive structure, the base conductive pad, the monolithic conductive column, and the conductive pads of each of the plurality of dies.

6. The semiconductor device assembly of claim 1, wherein the semiconductor device assembly further comprises:
an uppermost die of the plurality of dies as a top die stacked over the base die;
an assembly cover layer disposed over the upper dielectric layer of the uppermost die and including an upper surface; and
an external connector assembly, including:
an external conductive structure extending through the assembly cover layer from the upper surface to the uppermost die, and
an electric connector coupled to the upper surface of the assembly cover layer at the external conductive structure.

7. The semiconductor device assembly of claim 6, wherein the semiconductor device assembly is configured such that the electric connector is in electric communication with each of the plurality of dies via the external conductive structure, the base conductive pad, the monolithic conductive column, and the conductive pad of each of the plurality of dies.

8. The semiconductor device assembly of claim 1, wherein the base die further includes a second base conductive pad at the upper surface and each of the plurality of dies further includes a second conductive pad at the lower surface having a second bottom surface opposite the lower surface and a second opening extending through the semiconductor substrate and the second conductive pad from the second bottom surface to the upper surface, and wherein a second monolithic conductive column extends from the second base conductive pad through the second opening of each of the plurality of dies and in direct contact with a side surface of the second conductive pad of each of the plurality of dies.

* * * * *